(12) United States Patent
Kamikawa

(10) Patent No.: US 6,792,958 B2
(45) Date of Patent: Sep. 21, 2004

(54) SYSTEM FOR PROCESSING SUBSTRATE WITH LIQUID

(75) Inventor: Yuji Kamikawa, Tosu (JP)

(73) Assignee: Tokyo Electron Limited, Tokyo-To (JP)

(*) Notice: Subject to any disclaimer, the term of this patent is extended or adjusted under 35 U.S.C. 154(b) by 381 days.

(21) Appl. No.: 10/024,175

(22) Filed: Dec. 21, 2001

(65) Prior Publication Data
US 2002/0078980 A1 Jun. 27, 2002

(30) Foreign Application Priority Data
Dec. 25, 2000 (JP) ........................................ 2000-392322

(51) Int. Cl.[7] ............................................. B08B 15/00
(52) U.S. Cl. .................... 134/95.3; 134/99.1; 134/148; 134/186; 134/902
(58) Field of Search ........................... 134/94.1, 95.3, 134/99.1, 103.2, 137, 140, 148, 153, 186, 200, 902

(56) References Cited

U.S. PATENT DOCUMENTS

| | | | | |
|---|---|---|---|---|
| 4,493,333 A | * | 1/1985 | Layton | 134/76 |
| 4,693,777 A | * | 9/1987 | Hazano et al. | 156/345.31 |
| 5,054,988 A | * | 10/1991 | Shiraiwa | 414/404 |
| 5,191,908 A | * | 3/1993 | Hiroe et al. | 134/76 |
| 5,265,632 A | * | 11/1993 | Nishi | 134/133 |
| 5,551,984 A | * | 9/1996 | Tanahashi | 118/724 |
| 5,565,034 A | * | 10/1996 | Nanbu et al. | 118/668 |
| 5,567,267 A | * | 10/1996 | Kazama et al. | 156/345.27 |
| 5,806,543 A | * | 9/1998 | Ohmi | 134/61 |
| 5,975,097 A | * | 11/1999 | Yonemizu et al. | 134/95.2 |
| 6,200,432 B1 | * | 3/2001 | Kobayashi et al. | 204/192.12 |
| 6,435,199 B1 | * | 8/2002 | Kamikawa | 134/76 |
| 6,461,444 B1 | * | 10/2002 | Nishio et al. | 134/29 |
| 6,533,864 B1 | * | 3/2003 | Matsuyama et al. | 118/704 |

FOREIGN PATENT DOCUMENTS

| | | | |
|---|---|---|---|
| JP | 59-32132 | * | 2/1984 |
| JP | 11-74328 | * | 3/1999 |
| JP | 11-293458 | * | 10/1999 |

* cited by examiner

Primary Examiner—Frankie L. Stinson
(74) Attorney, Agent, or Firm—Smith, Gambrell & Russell, LLP

(57) ABSTRACT

There is provided a system in which transportation, assembly and maintenance can be easily carried out. The system comprises: a case carrying unit for carrying in/out a case accommodating therein the substrate; a liquid-processing unit and the processing liquid being supplied to process the substrate with the processing liquid; a substrate conveying unit for conveying the substrate between the case carrying unit and the liquid-processing unit; a processing liquid storing unit for storing, feeding and recovering the processing liquid which is supplied to the liquid-processing unit; and a plurality of frames each supporting one or more of the case carrying unit, the liquid-processing unit, the substrate conveying unit and the processing liquid storing unit, wherein the at least two of the plurality of frames are capable of being connected to and separated from each other.

12 Claims, 11 Drawing Sheets

SYSTEM FOR PROCESSING SUBSTRATE WITH LIQUID

BACKGROUND OF THE INVENTION

1. Field of the Invention

The present invention relates generally to a system for processing, such as cleaning, various substrates, such as semiconductor wafers and LCD substrates, with processing liquid.

2. Description of the Related Art

For example, in a semiconductor device fabricating process, there is used a wafer cleaning system for cleaning a semiconductor wafer serving as a substrate with a cleaning liquid, such as a chemical or water, to remove particles, contamination, such as organic contamination and metal contamination, and polymers after etching, from the wafer. There is also used a wafer drying system for removing droplets from the wafer and drying the wafer with an inert gas, such as nitrogen ($N_2$) gas, or IPA vapor having high volatility and hydrophilic property.

As such a cleaning/drying system, a system for batch-processing a plurality of wafers is known. For example, a case, in which a plurality of wafers are housed so that their principal planes are substantially perpendicular, is mounted at a predetermined position in the cleaning/drying system, and the plurality of wafers in the case are taken out by means of a conveying mechanism to be transferred to a wafer holding means for holding the wafers. Then, in a processing vessel, a predetermined liquid-processing and drying processing are carried out for the wafers, which are held by the wafer holding means so that the principal planes are substantially perpendicular. Thereafter, the wafers are conveyed to the case again by means of the conveying mechanism.

In recent years, with the high integration and mass production of semiconductor devices, the diameter of wafers increases from 200 mm to 300 mm. In accordance therewith, regarding cases for storing and conveying wafers, the cases accommodating therein the wafers in a perpendicular state are changed to the cases accommodating therein the wafers in a horizontal state.

However, if the mechanisms and members of the respective units for handling the wafers are enlarged in accordance with the increase of the size of the wafers without changing the structure of the conventional system, the enlargement of the whole system can not be avoided. With the enlargement of the system, it is required to consider the structure of the system so that it is possible to easily carry out the transportation of the system from a production field to an installed position at which the system is used, the assembly operation of the system at the installed position, and the maintenance of the interior of the system.

On the other hand, it is greatly hoped to improve the construction of the system to suppress the enlargement of the system while corresponding to the increase of the diameter of waters. In this case, with the change of the internal construction in the system, it is required to appropriately control the flow of air so as not to contaminate the wafers.

SUMMARY OF THE INVENTION

It is therefore an object of the present invention to eliminate the aforementioned problems and to provide a system for processing a substrate with a processing liquid, in which transportation, assembly and maintenance can be easily carried out. It is another object of the present invention to provide a system capable of handling substrates having a larger size than that of conventional substrates and of inhibiting the substrates from being contaminated.

In order to accomplish the aforementioned and other objects, according to one aspect of the present invention, there is provided a system for processing a substrate with a processing liquid, the system comprising: a case carrying unit for carrying in/out a case accommodating therein the substrate; a liquid-processing unit for supplying the processing liquid to process the substrate with the processing liquid; a substrate conveying unit for conveying the substrate between the case carrying unit and the liquid-processing unit; a processing liquid storing unit for storing the processing liquid, feeding the processing liquid to the liquid-processing unit and recovering the processing liquid from the liquid-processing unit; and a plurality of frames each supporting one or more of the case carrying unit, the liquid-processing unit, the substrate conveying unit and the processing liquid storing unit, wherein at least two of the plurality of frames are capable of being connected to and separated from each other.

According to the present invention, there is also provided a system for processing a substrate with a processing liquid, the system comprising: a case carrying unit for carrying in/out a case accommodating therein the substrate; a liquid-processing unit for supplying the processing liquid to process the substrate with the processing liquid; a substrate conveying unit for conveying the substrate between the case carrying unit and the liquid-processing unit; a processing liquid storing unit for storing the processing liquid, feeding the processing liquid to the liquid-processing unit and recovering the processing liquid from the liquid-processing unit; and a plurality of controllers for controlling the liquid-processing unit, the substrate conveying unit and the processing liquid storing unit, wherein each of the controllers is constructed as a boxed unit, and is arranged in an upper portion of the substrate conveying unit or the processing liquid storing unit.

According to the present invention, there is also provided a system for processing a substrate with a processing liquid, the system comprising: a case carrying unit for carrying in/out a case accommodating therein the substrate; a liquid-processing unit for supplying the processing liquid to process the substrate with the processing liquid; a substrate conveying unit for conveying the substrate between the case carrying unit and the liquid-processing unit; a processing liquid storing unit for storing the processing liquid, feeding the processing liquid to the liquid-processing unit and recovering the processing liquid from the liquid-processing unit; a plurality of controllers for controlling the liquid-processing unit, the substrate conveying unit and the processing liquid storing unit; a power supply unit for the plurality of controllers; and an exhaust system for collecting air exhausted from the plurality of controllers and air exhausted from the power supply unit, in one place, and exhausting air out of the system.

In these systems, each unit of the system is supported on a plurality of frames which can be separated from each other, so that it is possible to easily transport the system by dividing the whole system by separating the frames from each other. It is also possible to shorten the system producing period since each of the frames to be connected can be produced in a separate assembling process.

Since the controller for controlling each unit of the system is constructed as a boxed unit, it is possible to easily carry out the assembly, disassembly and maintenance of the system.

Since air exhausted from the respective controllers and power supply units are collected in one place to be exhausted, the exhaust system can have a simple structure. Also from this point, it is possible to easily carry out the assembly and maintenance of the system.

According to another aspect of the present invention, there is provided a system for processing a substrate with a processing liquid, the system comprising: a substrate transfer chamber provided with a holder formed so as to hold a substrate, the substrate being transferred between the holder and an outside of the substrate transfer chamber; a blower mechanism provided in a ceiling portion of the substrate transfer chamber; and a processing-vessel chamber provided with a processing vessel, the substrate held by the holder being carried into the processing vessel and the processing liquid being supplied to the substrate in the vessel to process the substrate with the processing liquid, wherein air supplied from the blower mechanism to the substrate transfer chamber is exhausted from the substrate transfer chamber via the processing-vessel chamber.

According to the present invention, there is also provided a system for processing a substrate with a processing liquid, the system comprising: a substrate transfer chamber provided with a holder formed so as to hold a substrate, the substrate being transferred between the holder and an outside of the substrate transfer chamber; a blower mechanism provided in a ceiling portion of the substrate transfer chamber; a processing-vessel chamber provided with a processing vessel, the substrate held by the holder being carried into the processing vessel and the processing liquid being supplied to the substrate in the vessel to process the substrate with the processing liquid; and a utility chamber provided with a liquid feeding mechanism for feeding the processing liquid to the processing vessel, and a processing liquid recovering mechanism for recovering the processing liquid fed to the processing vessel, wherein air supplied from the blower mechanism to the substrate transfer chamber is exhausted from the substrate transfer chamber via the processing-vessel chamber or the utility chamber.

According to the present invention, there is also provided a system for processing a substrate with a processing liquid, the system comprising: a case carrying unit for carrying in/out a case accommodating therein the substrate; a liquid-processing unit for supplying the processing liquid to process the substrate with the processing liquid; and a substrate conveying unit for conveying the substrate between the case carrying unit and the liquid-processing unit, the liquid-processing unit comprising: a substrate transfer chamber provided with a holder formed so as to hold a substrate, the substrate being transferred between the holder and the substrate conveying unit; a blower mechanism provided in a ceiling portion of the substrate transfer chamber; a processing-vessel chamber provided with a processing vessel, the substrate held by the holder being carried into the processing vessel and the processing liquid being supplied to the substrate in the vessel to process the substrate with the processing liquid; and a utility chamber provided with a liquid feeding mechanism for feeding the processing liquid to the processing vessel, and a processing liquid recovering mechanism for recovering the processing liquid fed to the processing vessel, wherein air supplied from the blower mechanism to the substrate transfer chamber is exhausted from the substrate transfer chamber via the processing-vessel chamber or the utility chamber.

In these systems, in the substrate transfer chamber in which the substrate is exposed in its uncovered state, it is possible to inhibit the adhesion of particles and so forth by clean air supplied from the blower mechanism provided in the ceiling portion of the substrate transfer chamber, so that it is possible to hold the high quality of the substrate. Since the cleanliness required for the processing-vessel chamber and the utility chamber is lower than that required for the substrate transfer chamber, it is possible to maintain a sufficient cleanliness by introducing and exhausting clean air supplied to the substrate transfer chamber. Therefore, it is not required to provide any exclusive blower mechanisms for the processing-vessel chamber and the utility chamber, so that it is possible to reduce the costs for the system.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiment of the present invention will be described below. A system according to the present invention can be applied to cleaning and drying systems for various substrates serving as objects to be processed. Therefore, in this preferred embodiment, a case where the present invention is applied to a cleaning system for carrying out the carrying-in, cleaning, drying and carrying-out of semiconductor wafers in the batch form.

Figure 1:
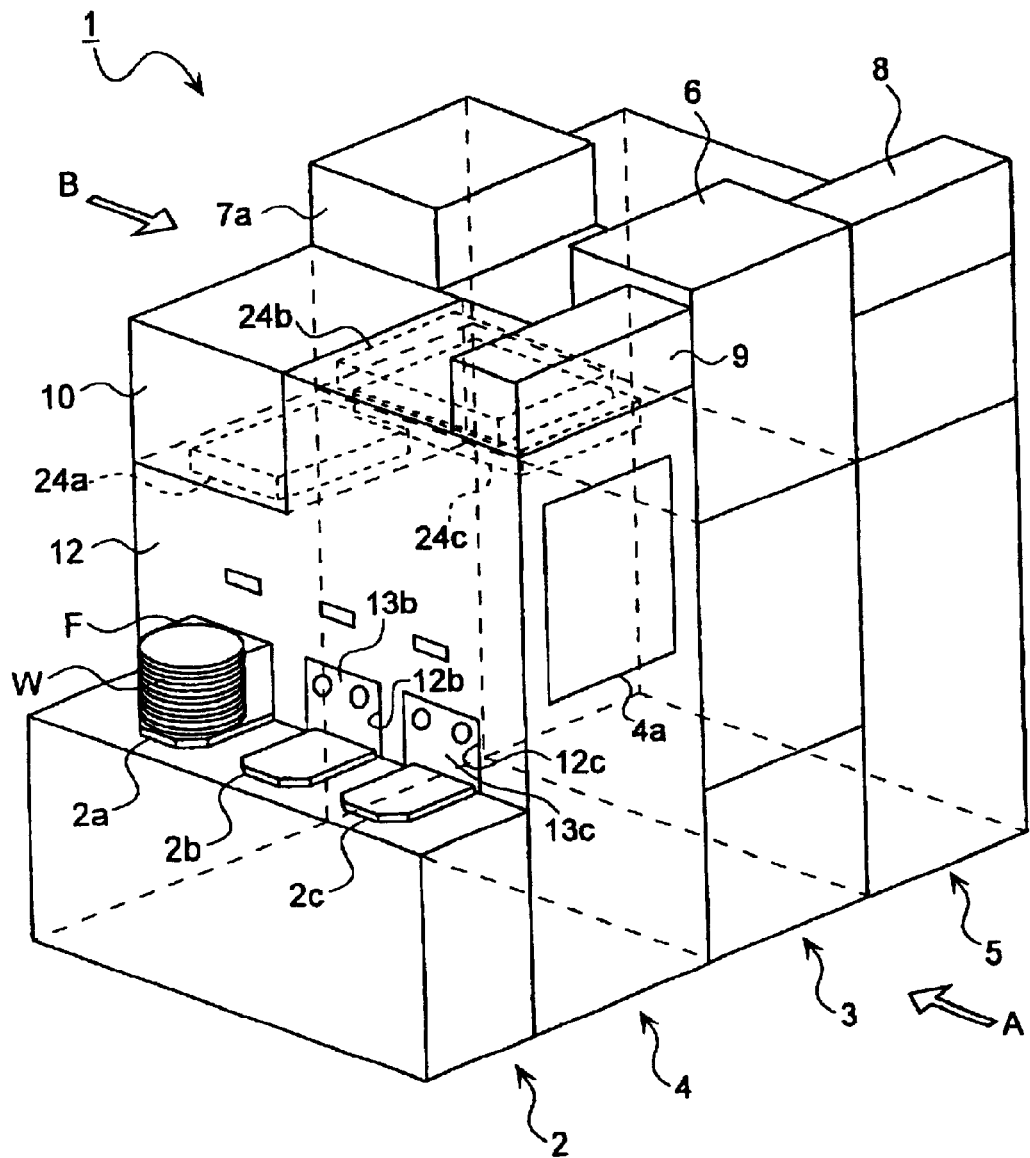
FIG. 1 is a perspective view of a preferred embodiment of a cleaning system according to the present invention.
Figure 2A:
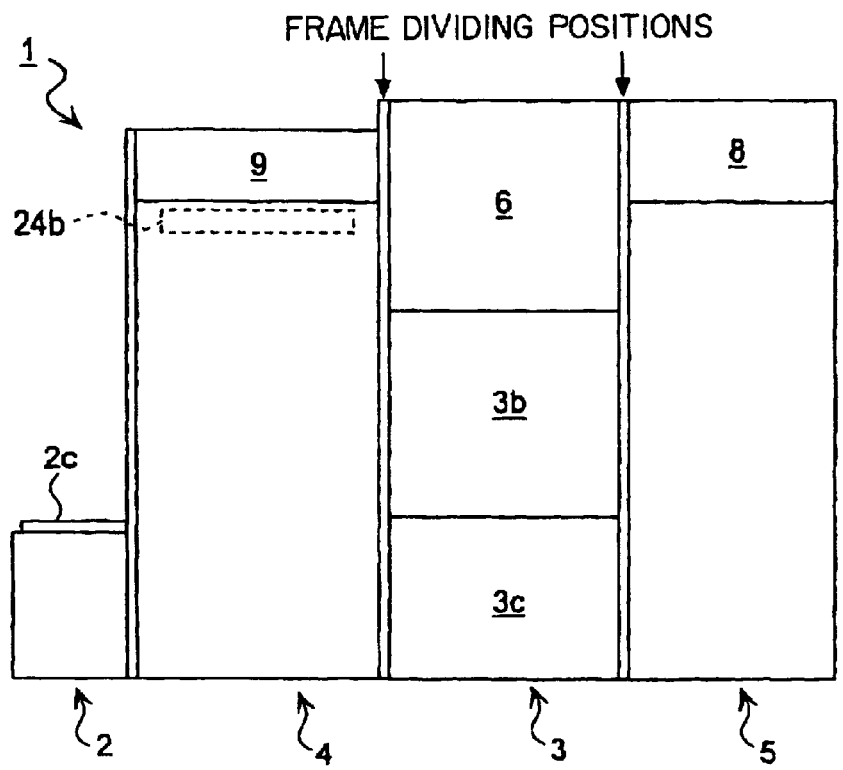
FIG. 2a is a side view which is viewed in a direction of arrow A in FIG. 1.

FIG. 1 is a perspective view of the appearance of a cleaning system 1 in this preferred embodiment. FIG. 2a is a side view which is viewed in a direction of arrow A in FIG. 1, and FIG. 2b is a side view which is viewed in a direction of arrow B in FIG. 1.

Figure 2B:
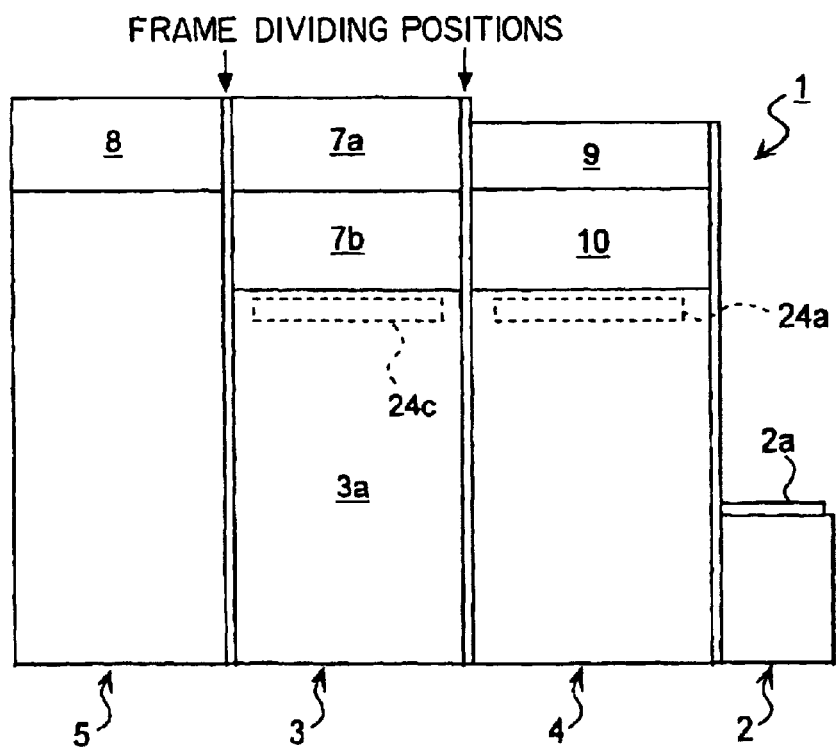
FIG. 2b is a side view which is viewed in a direction of arrow B in FIG. 1.

As shown in FIGS. 1, 2a and 2b, the cleaning system 1 comprises a hoop carrying unit 2, a cleaning unit 3, a wafer conveying unit 4 and a chemical storing unit 5. The hoop carrying unit 2 is provided with hoop stages 2a through 2c for supporting thereon a hoop (a case) F capable of accommodating therein a plurality of wafers W. The cleaning unit 3 is provided for cleaning the wafers W, and comprises a wafer transfer chamber 3a, a processing-vessel chamber 3b and a utility chamber 3c. The wafer conveying unit 4 is provided between the hoop carrying unit 2 and the cleaning unit 3, for conveying the wafers. The chemical storing unit 5 is provided for carrying out the storage, feeding and recovery of a cleaning chemical.

The upper portion of the cleaning unit 3 is provided with a power supply box 6 for housing therein a power supply unit for various electric driving mechanisms and electronic controllers which are provided in the cleaning system 1. The upper portion of the cleaning unit 3 is also provided with a temperature control box 7a for housing therein a temperature controller for controlling the temperature of the chemical stored in the chemical storing unit 5, and a process control box 7b for housing therein a process controller for controlling the processing process for the wafers in the cleaning unit 3. The upper portion of the wafer conveying unit 4 is provided with a display box 9 for housing therein a display unit for controlling various display panels which are provided in the cleaning system 1, and a conveying mechanism control box 10 for housing therein a conveying mechanism controller for controlling the process for the wafers W in the wafer conveying unit 4. The upper portion of the chemical storing unit 5 is provided with a heat exhaust box 8 for housing therein a heat exhaust unit for collecting and exhausting (naturally releasing) heated air from the respective boxes. That is, the above described power supply unit, display unit, heat exhaust unit and controllers are housed in the boxes to be constructed as boxed units, respectively.

As shown in FIGS. 2a and 2b, the cleaning system 1 can be divided into the wafer conveying unit 4, the cleaning unit 3 and the chemical storing unit 5, by the separation between frames. That is, the framework of the hoop carrying unit 2 and wafer conveying unit 4, and the framework of the cleaning unit 3, and the framework of the chemical storing unit 5 are integrally formed as first, second and third frames, respectively. By detachably connecting the first and third frames to the second frame of the cleaning unit 3, the frame of the whole cleaning system 1 is assembled. Thus, the cleaning system 1 comprises a plurality of frames, at least two of which can be connected and separated, so that the transportation of the cleaning system 1, the carrying-in of the cleaning system 1 into a cleaning room or the like, and the assembly of the cleaning system 1 can be easily carried out. The respective parts can be produced in separate assembling process, so that it is possible to shorten the system producing period.

Figure 3:
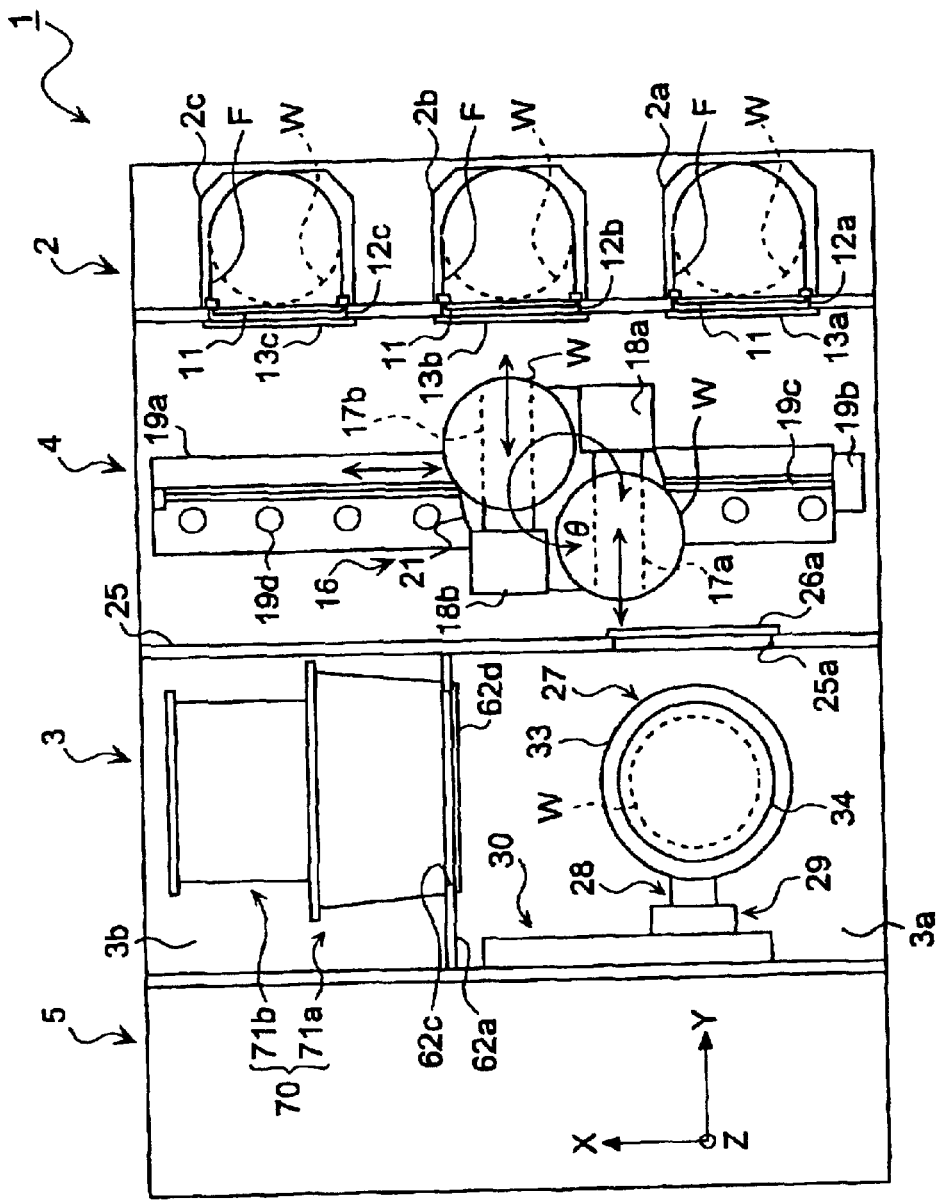
FIG. 3 is a horizontal sectional view showing the internal structure of the cleaning system of FIG. 1.
Figure 4:
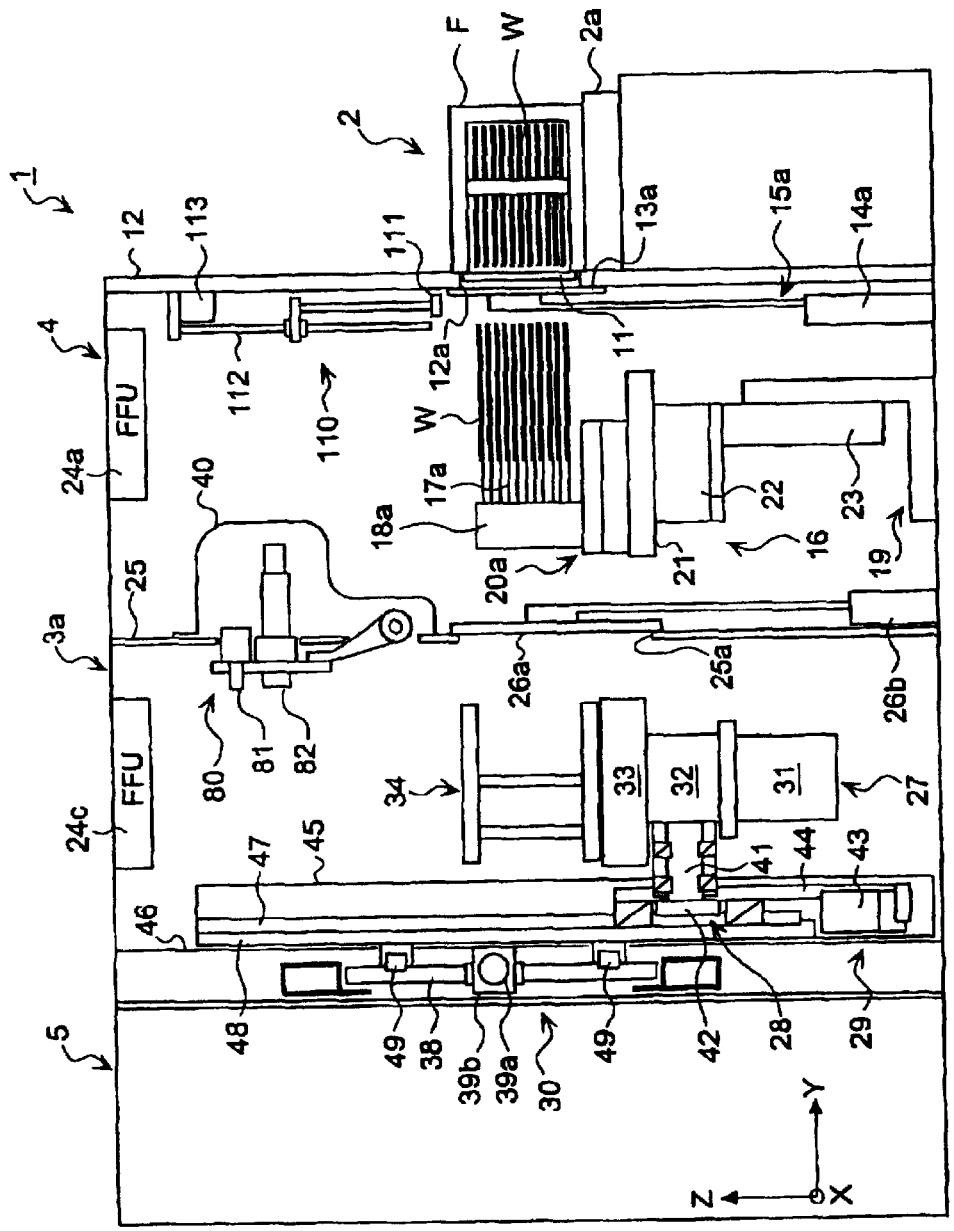
FIG. 4 is a longitudinal sectional view showing the internal structure of the cleaning system of FIG. 1.
Figure 5:
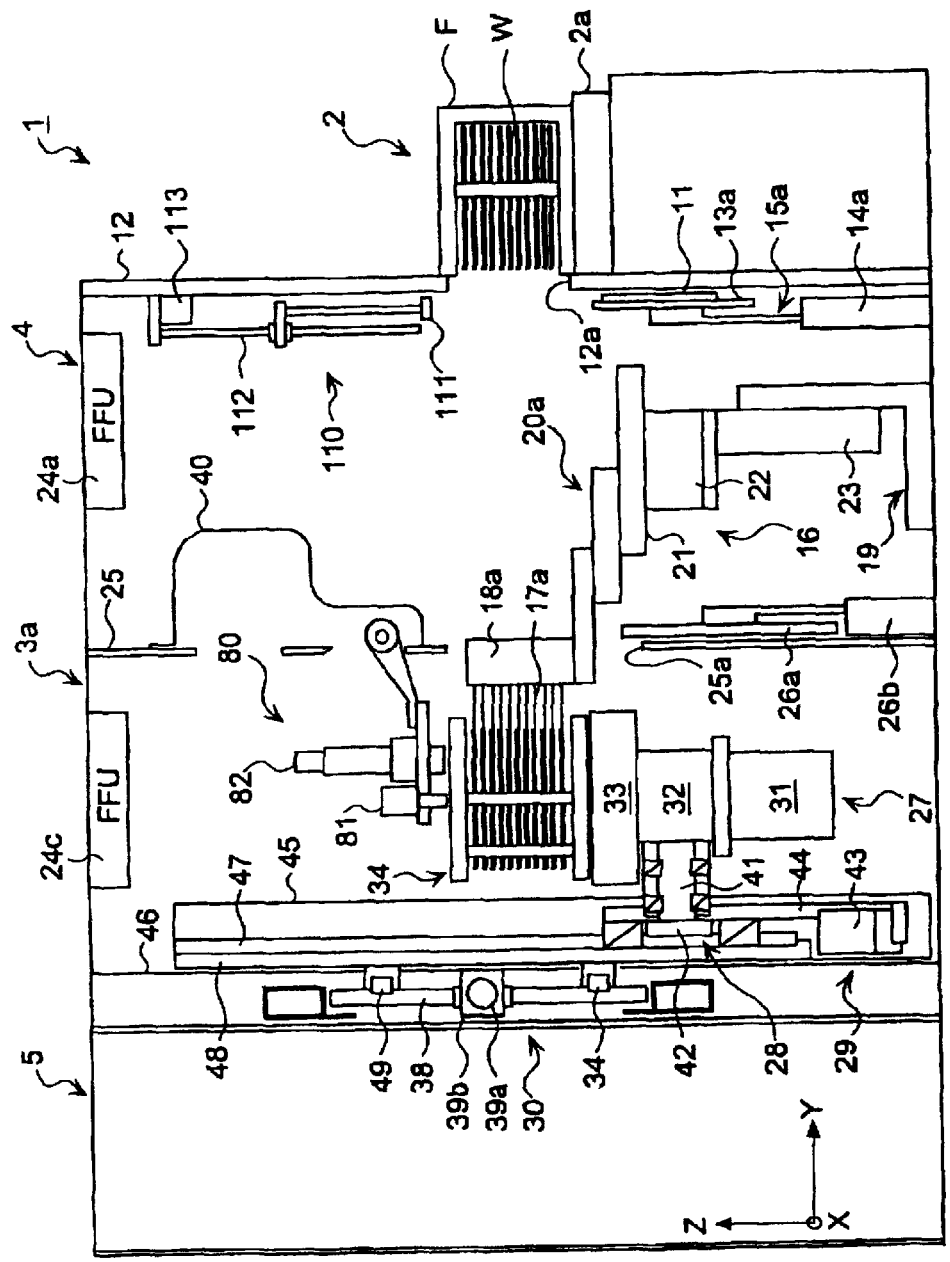
FIG. 5 is a longitudinal sectional view showing the internal structure of the cleaning system of FIG. 1 in another state.

FIG. 3 is a horizontal sectional view showing the internal structure of the cleaning system 1, and FIG. 4 is a longitudinal sectional view showing the internal structure of the cleaning system 1. FIG. 5 shows a state that a part of the mechanism shown in FIG. 4 is operated. FIGS. 3 through 5 only show the hoop carrying unit 2, the cleaning unit 3, the wafer conveying unit 4 and the chemical storing unit 5, and do not show the power supply box 6 and other various boxes which are provided in the upper portions of the cleaning unit 3, wafer conveying unit 4 and chemical storing unit 5. FIGS. 4 and 5 show the schematic structure of the wafer transfer chamber 3a in the cleaning unit 3. The respective units will be described below in detail.

First, the hoop carrying unit 2 will be described. The hoops F supported on the hoop stages 2a through 2c are capable of accommodating therein a plurality of, e.g., twenty-five, wafers W at regular intervals so that their principal planes are horizontal. One side of each of the hoops F is provided with a wafer carrying port for carrying the wafers W in/out. The wafer carrying port is open and closed by a lid 11.

The boundary wall 12 between the wafer carrying unit 4 and the hoop carrying unit 2 is provided with windows 12a through 12c. The hoops F are supported on the hoop stages 2a through 2c so that the outer peripheral portion of the wafer carrying port formed on the hoop F closes windows 12a through 12c and so that the lid 11 can be detached by lid opening/closing mechanisms 15a through 15c (see FIG. 5).

The wafer conveying unit 4 will be described below. Inside of the boundary wall 12 (on the side of the wafer conveying unit 4), the lid opening/closing mechanisms 15a through 15c are provided at the positions of the windows 12a through 12c, respectively. These lid opening/closing mechanisms 15a through 15c comprise shutters 13a through 13c for opening and closing the windows 12a through 12c, and lifting mechanisms 14a through 14c for vertically moving the shutters 13a through 13c, respectively. The wafer conveying unit 4 is provided with a wafer inspection mechanism 110, a wafer conveying mechanism 16, filter fan units (FFU) 24a and 24b serving as blower mechanisms, a shutter 26a, a lifting mechanism 26b for the shutter 26a, and an operation panel 4a. The shutter 26a is provided for opening and closing a window 25a formed in the boundary wall 25 for separating the wafer conveying unit 4 from the cleaning unit 3.

The lid opening/closing mechanisms 15a through 15c have a lid holding means (not shown), such as an sucking pad, so as to be capable of vertically moving the lids 11 of the hoops F together with the shutters 13a through 13c. When the hoops F are not supported on the hoop stages 2a through 2c, the shutters 13a through 13c close the windows 12a through 12c to prevent particles and so forth from entering the wafer conveying unit 4 from the outside. When the wafers W are carried out of or in the hoops F, the shutters 13a through 13c and the lids 11 of the hoops F are moved downwards by the lid opening/closing mechanisms 15a through 15c to open the windows 12a through 12c to allow the conveying arms 17a and 17b of the wafer conveying mechanism 16 to access the hoops F.

The wafer inspection mechanism 110 is provided for each of the windows 12a through 12c for measuring the number of the wafers W in the hoop F and for inspecting the state of the housed wafers W. The wafer inspection mechanism 110 is designed to cause a reflection type optical sensor 111, which has transmitting and receiving parts using, e.g., infrared laser, to scan along a guide 112 in Z directions (vertical directions). Thus, it is possible to receive reflected light from the end faces of the wafers W to inspect the number and state of the wafers W housed in the hoop F, e.g., whether the wafers W are housed in the hoop F at regular intervals so as to be substantially in parallel, whether the wafers W are housed so that two of the wafers W overlap, whether the wafers W are housed so as to be inclined, and whether the wafers W are shifted from a predetermined position in the hoop F.

If the wafer inspection mechanism 110 is mounted on the wafer conveying mechanism 16 so that the wafer inspection mechanism 110 can move together with the wafer conveying mechanism 16, the wafer inspection mechanism 110 may be provided only at one place. For example, a sensor for verifying the number of the housed wafers W, and a sensor for inspecting the state of the housed wafers W may be separately provided. The wafer inspection mechanism 110 may be provided in the lid opening/closing mechanisms 15a through 15c.

The wafer conveying mechanism 16 provided in the wafer conveying unit 4 has a linear driving mechanism 19, conveying arms 17a and 17b, and supporting members 18a and 18b. The conveying arms 17a and 17b for conveying the wafers W are supported on the supporting members 18a and 18b, respectively. The supporting members 18a and 18b are mounted on a rotatable table 21 via sliding mechanisms 20a and 20b, respectively. A rotating mechanism 22 for rotating the table 21, and a lifting mechanism 23 for vertically moving the rotating mechanism 22 are provided.

The linear driving mechanism 19 has a guide 19a extending in X directions, a motor 19b, and a pivot 19c rotated by the motor 19b. The base portion of the guide 19a is formed with an outlet 19d. The pivot 19c engages the lifting mechanism 23, so that the lifting mechanism 23 can move in X directions by the rotation of the pivot.

The wafer conveying mechanism 16 is provided with two systems of conveying arms 17a and 17b. Thus, for example, the conveying arms 17a can be used for conveying unprocessed wafers W, and the conveying arms 17b can be used for conveying cleaned wafers W. In this case, as compared with a case where only one system of conveying arms are provided, it is possible to effectively prevent particles and so forth, which adhere to unprocessed wafers W, from adhering to the conveying arms and adhering to processed wafers W. By providing the two systems of conveying arms, the next unprocessed wafer W can be delivered to the cleaning unit 3 immediately after the processed wafer W is received. Thus, it is possible to effectively use the process moving time of the system.

In order to allow each of the conveying arms 17a to convey one of the wafers W and in order to allow twenty-five wafers housed in the hoop F to be conveyed at a time, twenty-five conveying arms 17a are held on the supporting member 18a substantially in parallel at regular intervals. Also, twenty-five conveying arms 17b are held on the supporting member 18b substantially in parallel at regular intervals. When the wafers W are delivered between the hoop F or a rotor (holder) 34, which will be described later, and the conveying arms 17a, 17b, it is required to vertically move the conveying arms 17a and 17b by a predetermined distance. The vertical movement of the conveying arms 17a and 17b can be carried out by the lifting mechanism 23. The supporting members 18a and 18b may be additionally provided with lifting mechanisms for vertically moving the conveying arms 17a and 17b, respectively.

The conveying arms 17a and 17b, together with the supporting members 18a and 18b, can be slide in longitudinal directions of the conveying arms 17a and 17b by means of the sliding mechanism 20a and 20b, respectively (see FIGS. 3 and 5). The table 21 can be rotated by the rotating mechanism 22 on a horizontal plane in a direction of θ in FIG. 3, and the upper portion of the table 21 above the lifting mechanism 23 can be moved by the linear driving mechanism 19 in X directions. Thus, the conveying arms 17a and 17b can also access the hoops F supported on the hoop stages 2a through 2c, and the rotor 34 which will be described later, and can convey the wafers W in a horizontal state between the hoops F supported on the hoop stages 2a through 2c, and rotor 34.

FIG. 5 shows a state that the sliding mechanism 20a is operated to slide the conveying arm 17a and the supporting member 18a toward the rotor 34 to deliver the wafers W to the rotor 34. By causing the height of the wafers W in the hoop F to be equal to the height at which the wafers W are held in the rotor 34, it is possible to omit a process for causing the height of the conveying arm 17a to be equal to the conveying arm 17b by means of the lifting mechanism 23.

In the above described wafer conveying mechanism 16, the conveying arms 17a and 17b are arranged so as to be symmetrical with respect to the rotation center of the table 21. Therefore, if the table 21 is rotated while the sliding mechanisms 20a and 20b are not expanded, even if the wafers W are held by the conveying arms 17a and 17b, it is possible to narrow the range of the trajectories of the conveying arms 17a and 17b passing during rotation. Thus, the space occupied by the wafer conveying unit 4 in the cleaning system 1 can be saved.

Figure 6:
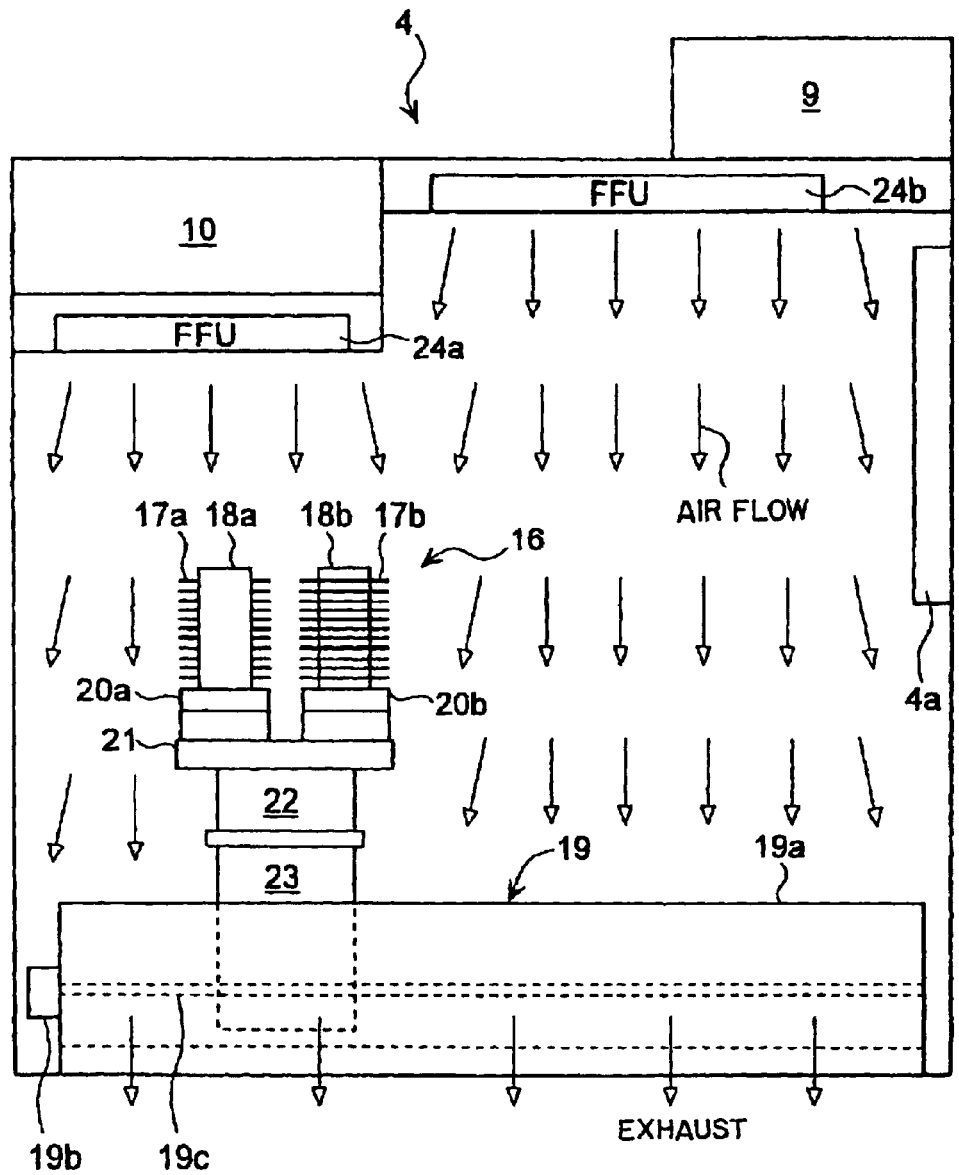
FIG. 6 is a cross-sectional view of a wafer conveying unit.

FIG. 6 shows a cross section of the wafer conveying unit 4. The ceiling portion of the wafer conveying unit 4 has lower and higher portions. The lower portion of the ceiling is provided with an FFU 24a, and the higher portion thereof is provided with an FFU 24b. Above the FFU 24a, the conveying mechanism control box 10 is provided. Above the FFU 24b, the display box 9 is provided. The FFUs 24a and 24b can intake air from the side or top face of the cleaning system 1.

By providing the higher portion of the ceiling in the wafer conveying unit 4, it is possible to improve operatability when the operator enters the wafer conveying unit 4 to carry out the cleaning of the interior of the wafer conveying unit 4, the repair of the wafer conveying mechanisms 16 and so forth, and the repair and maintenance of installed articles in the cleaning unit 3. The conveying mechanism control box 10 for controlling various driving mechanisms, such as the wafer conveying mechanism 16 and the wafer inspection mechanism 110, which are provided in the wafer conveying unit 4, is integrally formed with the wafer conveying unit 4. Therefore, the connection of the conveying mechanism control box 10 with various driving mechanisms in the wafer conveying unit 4, and the assembly of the wafer conveying unit 4 can be easily carried out.

As described above, the frame of the cleaning system 1 can be separated between the wafer conveying unit 4 and the cleaning unit 3, so that the wafer conveying unit 4 and the cleaning unit 3 are separately transported during the transportation of the cleaning system 1. At this time, if the control system for a unit supported on one frame is provided so as to be supplied on another frame, it is required to provide piping and wiring extending between both frames, so that there is a problem in that it takes a lot of time to install the cleaning system 1 at the installed place. On the other hand, in the cleaning system 1 wherein the conveying mechanism control box 10 for controlling various driving mechanisms provided in the wafer conveying unit 4 is provided in the wafer conveying unit 4, this problem is not caused, and it is possible to shorten the installation time. The cleaning unit 3 which will be described later in detail also has such a characteristic.

FIG. 6 shows the flow of clean air (down flow) blown into the wafer conveying unit 4 from the FFUs 24a and 24b. By this down flow, it is possible to prevent particles and so forth from adhering to the wafers W which are conveyed in the uncovered state by the wafer conveying mechanism 16. The particles and so forth, which are produced by the driving of the wafer conveying mechanism 16, are exhausted by the down flow from an outlet (not shown) formed in the bottom of the wafer conveying unit 4, and an outlet 19d formed in the base of the linear driving mechanism 19.

The lower portions of the FFU 24a and 24b may be provided with an ionizer for de-electrifying the wafers W. While the windows 12a through 12c are open, a part of the down flow from the FFU 24a also flows into the hoop F to prevent particles and so forth from adhering to parts in the hoop F. If the hoop F is formed with a vent hole, the down flow which is flown into the hoop F is discharged from the hoop carrying unit 2 via the hoop F.

The boundary wall 25 for partitioning the wafer conveying unit 4 and the cleaning unit 3 is formed with the window 25a for conveying the wafers W. This window 25a is open and closed by the shutter 26a. While the shutter 26a has been provided on the side of the wafer conveying unit 4 in the cleaning system 1, it may be provided on the side of the cleaning unit 3. The conveyance of the wafers W between the wafer conveying unit 4 and the cleaning unit 3 is carried out via the window 25a. Since the atmosphere in the wafer conveying unit 4 can be separated from the atmosphere in the cleaning unit 3 by the shutter 26a, it is possible to prevent contamination from expanding to the wafer conveying unit 3 even if the processing liquid flies in the cleaning unit 3 or even if the vapor of the processing liquid diffuses.

Subsequently, the cleaning unit 3 will be described. As shown in FIGS. 1 through 5, the cleaning unit 3 comprises a wafer transfer chamber 3a, a processing-vessel chamber 3b and a utility chamber 3c. The wafer transfer chamber 3a is provided with an FFU 24c, a rotor rotating mechanism 27, an attitude converting mechanism 28, a Z-axis linear driving mechanism 29, an X-axis linear driving mechanism 30, and covers 45 and 46.

The attitude converting mechanism 28 is provided for controlling the attitude of the rotor rotating mechanism 27. The Z-axis linear driving mechanism 29 is provided for moving the rotor rotating mechanism 27 and the attitude converting mechanism 28 in vertical directions. The X-axis linear driving mechanism 30 is provided for moving the Z-axis linear driving mechanism 29 in horizontal directions. The cover 45 is provided for preventing particles, which are produced from the attitude converting mechanism 28 and the Z-axis linear driving mechanism 29, from flying toward the rotor rotating mechanism 27 to adhere to the wafers W. The cover 46 is provided for preventing particles, which are produced from the X-axis linear driving mechanism 30, from flying toward the rotor rotating mechanism 27 to adhere to the wafers W.

Figure 7:
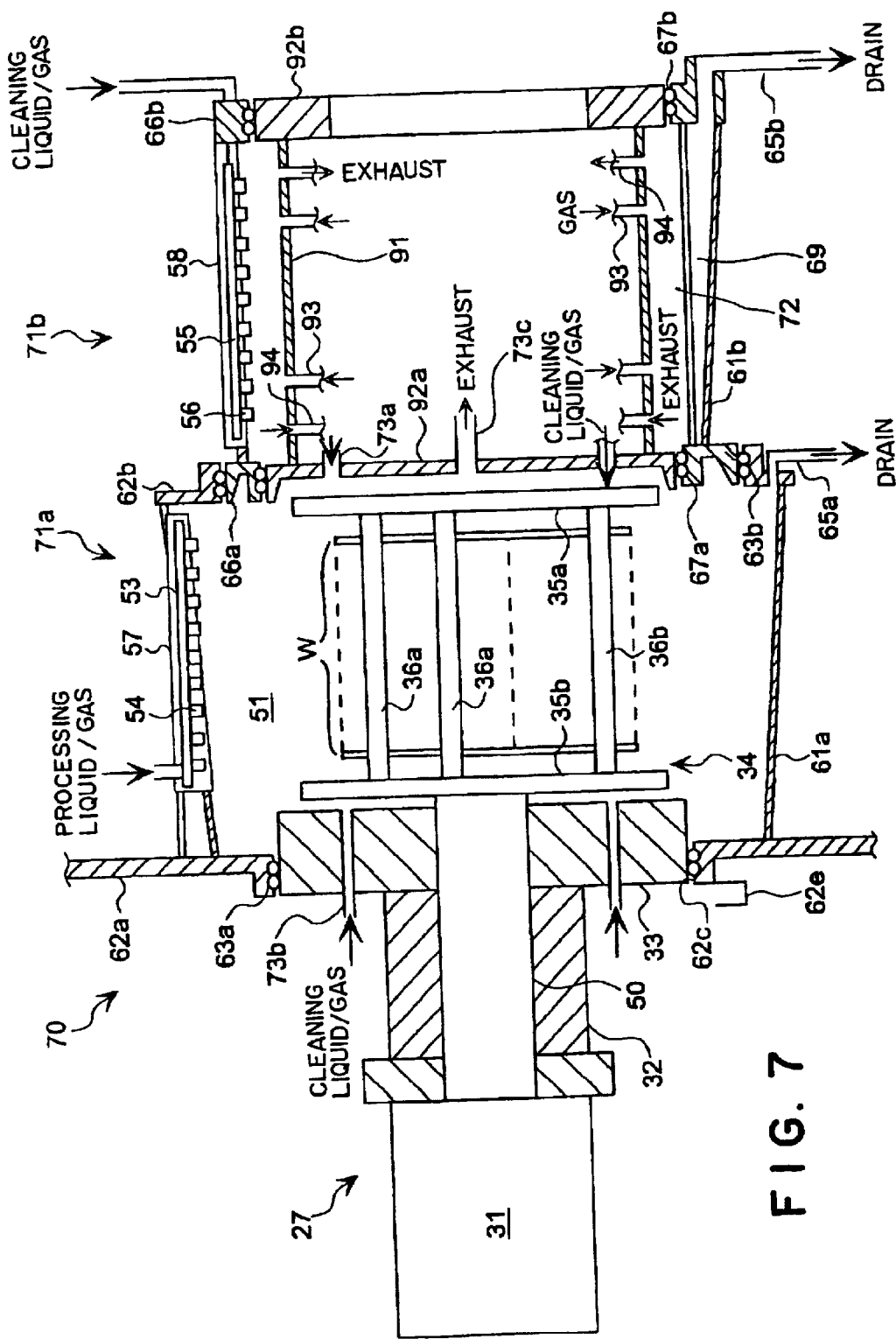
FIG. 7 is a longitudinal sectional view showing a state that a rotor is inserted into a processing vessel.
Figure 8:
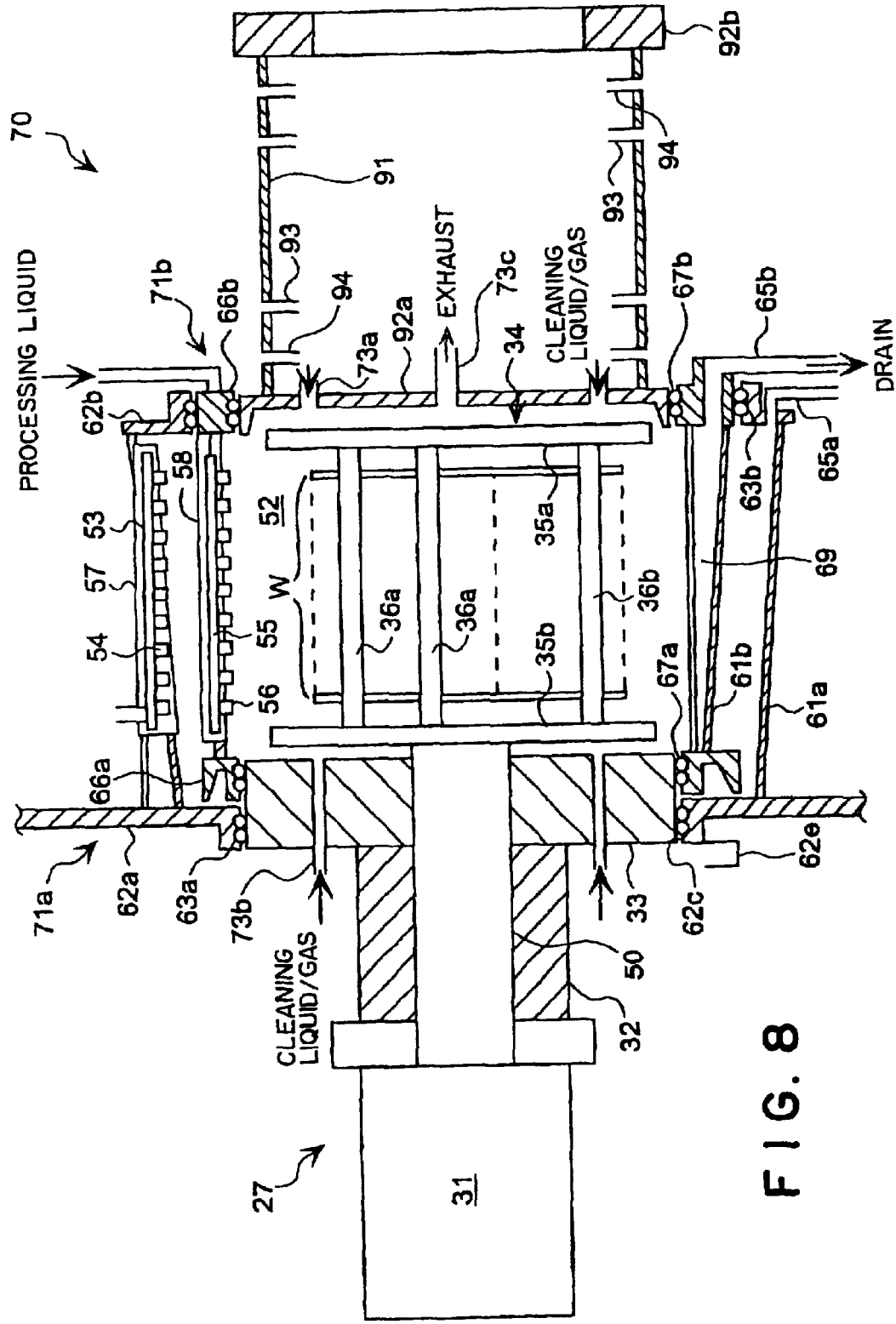
FIG. 8 is a longitudinal sectional view showing another state that a rotor is inserted into a processing vessel.

The processing-vessel chamber 3b is provided with a processing vessel 70 having a double structure comprising an outer processing vessel 71a fixed in the processing-vessel chamber 3b, and an inner processing vessel 71b slidable in horizontal direction. FIGS. 7 and 8 are sectional views showing a state that the rotor 34 having the rotor rotating mechanism 27 is inserted into the processing vessel 70 provided in the processing-vessel chamber 3b. FIG. 7 shows a state that the inner processing vessel 71b is positioned at a retracted position at which the inner processing vessel 71b is retracted to the outside of the outer processing vessel 71a. FIG. 8 shows a state that the inner processing vessel 71b is positioned at a processing position at which the inner processing vessel 71b is housed in the outer processing vessel 71a.

The outer processing vessel 71a has a cylindrical body 61a, a ring member 62b provided on one end face of the cylindrical body 61a, a sealing mechanism 63b provided on the inner peripheral surface of the ring member 62b, a processing liquid discharging nozzle 62b, a nozzle case 57 for housing therein the nozzle 53, and an exhaust/liquid-discharging pipe 65a. The processing liquid discharging nozzle 53 is formed with a large number of processing liquid discharging holes 54 in horizontal directions, and is mounted on the cylindrical body 61a. The exhaust/liquid-discharging pipe 65a is provided in the lower portion of the outer processing vessel 71a, and can discharge the processing liquid and exhaust the atmosphere.

The other end face of the cylindrical body 61a is mounted on the vertical wall 62a. The vertical wall 62 is formed with an opening 62c for allowing the entering/leaving of the rotor 34. As shown in FIG. 3, the opening 62c can be open and closed by a lid 62d. The vertical wall 62a is provided with a sealing mechanism 63a on a portion corresponding to the outer periphery of the opening 62c. The boundary portion between the wafer transfer chamber 3a and the processing-vessel chamber 3b is formed with a vent hole 64a (see FIG. 10). The boundary portion between the wafer transfer chamber 3a and the utility chamber 3c is formed with a vent hole 64b (see FIG. 10).

The inner processing vessel 71b has a cylindrical body 61b, ring members 66a and 66b provided on the end face of the cylindrical body 61b, sealing mechanisms 67a and 67b, a processing liquid discharging nozzle 55, a nozzle case 58 housing therein the nozzle 55, and an exhaust/liquid-discharging pipe 65b. Two sealing mechanisms 67a and two sealing mechanisms 67b are provided on the inner peripheral surfaces of the ring members 66a and 66b, respectively. The processing liquid discharging nozzle 55 is formed with a large number of processing liquid discharging holes 56 in horizontal directions, and is mounted on the cylindrical body 61b. The exhaust/liquid-discharging pipe 65b is provided in the lower portion of the inner processing vessel 71b, and can discharge the processing liquid and exhaust air. The processing-vessel chamber 3b is provided with a disk 92a, a ring member 92b and a cylindrical body 91. The disk 92a is provided with a cleaning liquid discharging nozzle 73a and an exhaust pipe 73c. The cylindrical body 91 is provided with a gas supply nozzle 93 and an exhaust pipe 94.

The utility chamber 3c is provided with a pressure rising pump for the processing liquid supplied to the outer processing vessel 71a and inner processing vessel 71b, and pipe lines for guiding the processing liquid and so forth, which are discharged from the outer processing vessel 71a and inner processing vessel 71b, to the outside.

The rotor rotating mechanism 27 comprises a rotor 34, a motor (driving mechanism) 31 for rotating the rotor 34, a connecting member 32 for connecting the attitude converting mechanism 28, a lid 33, and a rotation shaft 50. The motor (driving mechanism) 31 is designed to rotate the rotor 34 so that the wafer W held by the rotor 34 rotates in plane. The lid 33 is designed to close the opening 62c formed in the vertical wall 62a, when the rotor 34 is inserted into the outer processing vessel 71a which will be described later. The rotation shaft 50 passes through the connecting member 32 and the lid 33 to connect the rotor 34 to the motor 31.

Figure 9:
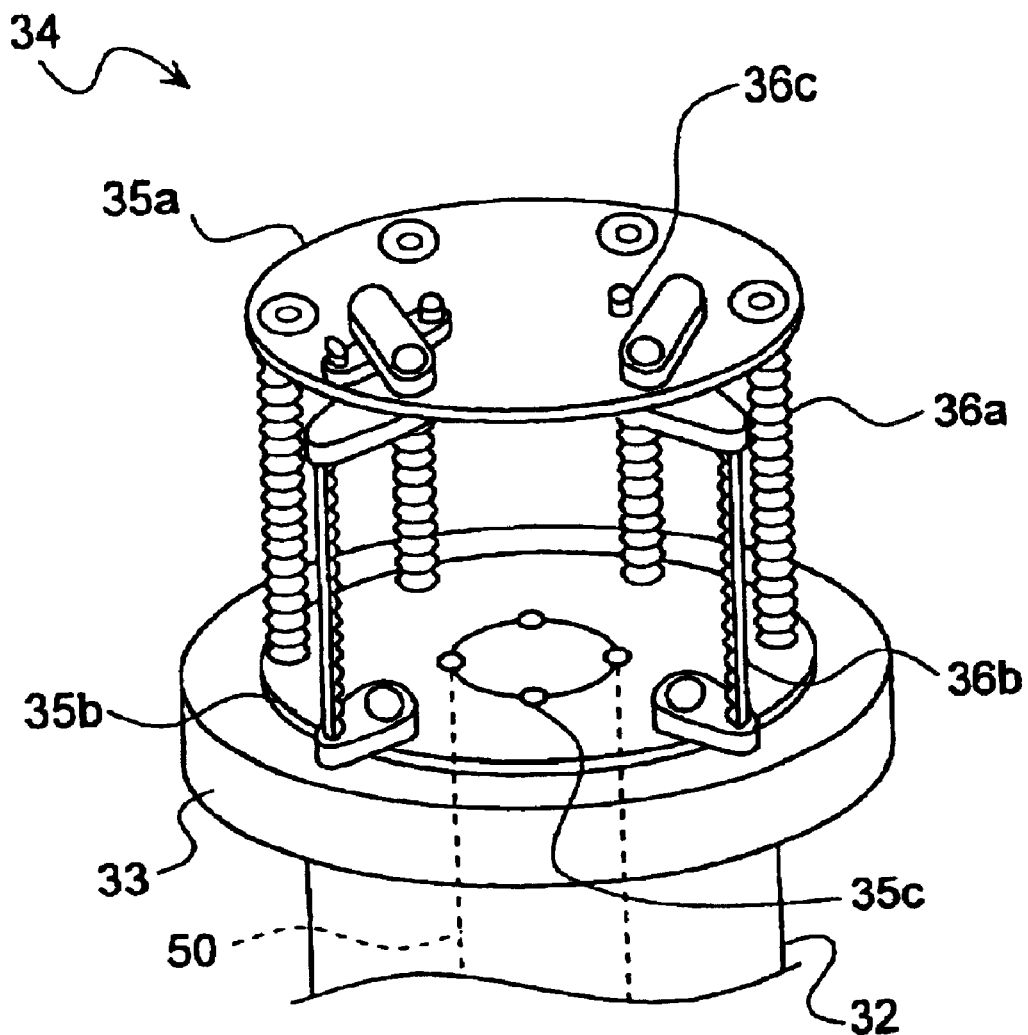
FIG. 9 is a perspective view showing the structure of a rotor.

FIG. 9 is a perspective view showing the structure of the rotor 34. The rotor 34 has a pair of disks 35a and 35b which are arranged at a predetermined interval, a stationary member 36a, a movable member 36b which can be open and closed, and a lock pin 36c for controlling the opening and closing of the movable member 36b. The stationary member 36a and the movable member 36b are formed with grooves or the like for holding the wafers W. The boundary wall 25 is provided with a holder opening/closing mechanism 80 for opening and closing the movable member 36b (see FIGS. 4 and 5). The holder opening/closing mechanism 80 is movable between the retracted position shown in FIG. 4 and the operated position shown in FIG. 5, and has a lock pin pressing cylinder 81 and a holder opening/closing cylinder 82. A cover 40 is provided in a portion of the boundary wall 25, on which the holder opening/closing mechanism 80 is provided, for separating the wafer conveying unit 4 from the cleaning unit 3.

The fixing of the disk 35b to the rotation shaft 50 can be carried out by, e.g., a screw 35c. The stationary member 36a can be fixed between the disks 35a and 35b by fixing the stationary member 36 by a screw from the outside of the disks 35a and 35b. For example, the lock pin 36c protrudes outside in a usual state. In this state, the lock pin 36 can not open and close the movable member 36b. On the other hand, as shown in FIG. 5, when the holder opening/closing mechanism 80 accesses the rotor 34 so that the lock pin 36c is pressed to the inside of the rotor 34 by the pressing force from the lock pin pressing cylinder 81, it is possible to set such a state that the movable member 36 can be open and closed by the holder opening/closing cylinder 82.

Thus, in a state that the movable member 36b is open, the wafers W can be delivered between the rotor 34 and the conveying arms 17a, 17b. On the other hand, in a state that the movable member 36b, the wafers W in the rotor 34 are maintained so as not to protrude from the rotor 34 to the outside.

The attitude converting mechanism 28 for controlling the attitude of the rotor rotating mechanism 27 has a rotation mechanism 42, and a rotation shaft 41 mounted on the rotation mechanism 42. The rotation shaft 41 is fixed to the connecting member 32 of the rotor rotating mechanism 27. By the rotation mechanism 42, the whole rotor rotating mechanism 27 can be held in an attitude (vertical attitude) in which the wafers W are held in a horizontal state as shown in FIG. 4 or 5. As shown in FIGS. 7 and 8, the attitude of the wafers W can be converted into an attitude (horizontal attitude), in which the wafers W are held in a vertical state, to be held.

The Z-axis linear driving mechanism 29 has a motor 43, a power transmitting means 44, a guide 47, and a supporting body 48 for supporting the guide 47. The power transmitting means 44 is designed to transmit the rotation driving force and displacement of the motor 43. The attitude converting mechanism 28 engages the guide 47 so as to be capable of moving along the guide 47. If the motor 43 is rotated, the rotation driving force and displacement thereof is transmitted to the attitude converting mechanism 28 via the power transmitting means 44. Thus, the attitude converting mechanism 28, together with the rotor rotating mechanism 27, can move along the guide 47 in Z directions (vertical directions) by a predetermined distance.

While the mechanism for converting the rotational displacement of the motor 43 to the linear displacement has been used as the Z-axis linear driving mechanism 29, it should not be limited to such a mechanism. For example, in place of the motor 43, a driving mechanism for directly causing a linear displacement, such as an air cylinder, may be used.

The X-axis linear driving mechanism 30 has a guide 49, a motor (not shown), a ball screw 39a, an engaging member 39b, and a connecting member 38. The engaging member 39b engages the ball screw 39a connected to the motor. The connecting member 38 engages the guide 49 to connect the engaging member 39b to the supporting body 48. By rotating the motor, the ball screw 39a operates, and the engaging member 39b moves in X directions in accordance with the operation of the ball screw 39a. At this time, the connecting member 38 connects the engaging member 39b to the supporting member 48, so that the connecting member 38 and the supporting member 48, together with the engaging member 39b, move in X directions. That is, when the engaging member 39b moves in X directions, the rotation mechanism 27, the attitude converting mechanism 28 and the Z-axis linear driving mechanism 29 simultaneously move in X directions.

Figure 10:
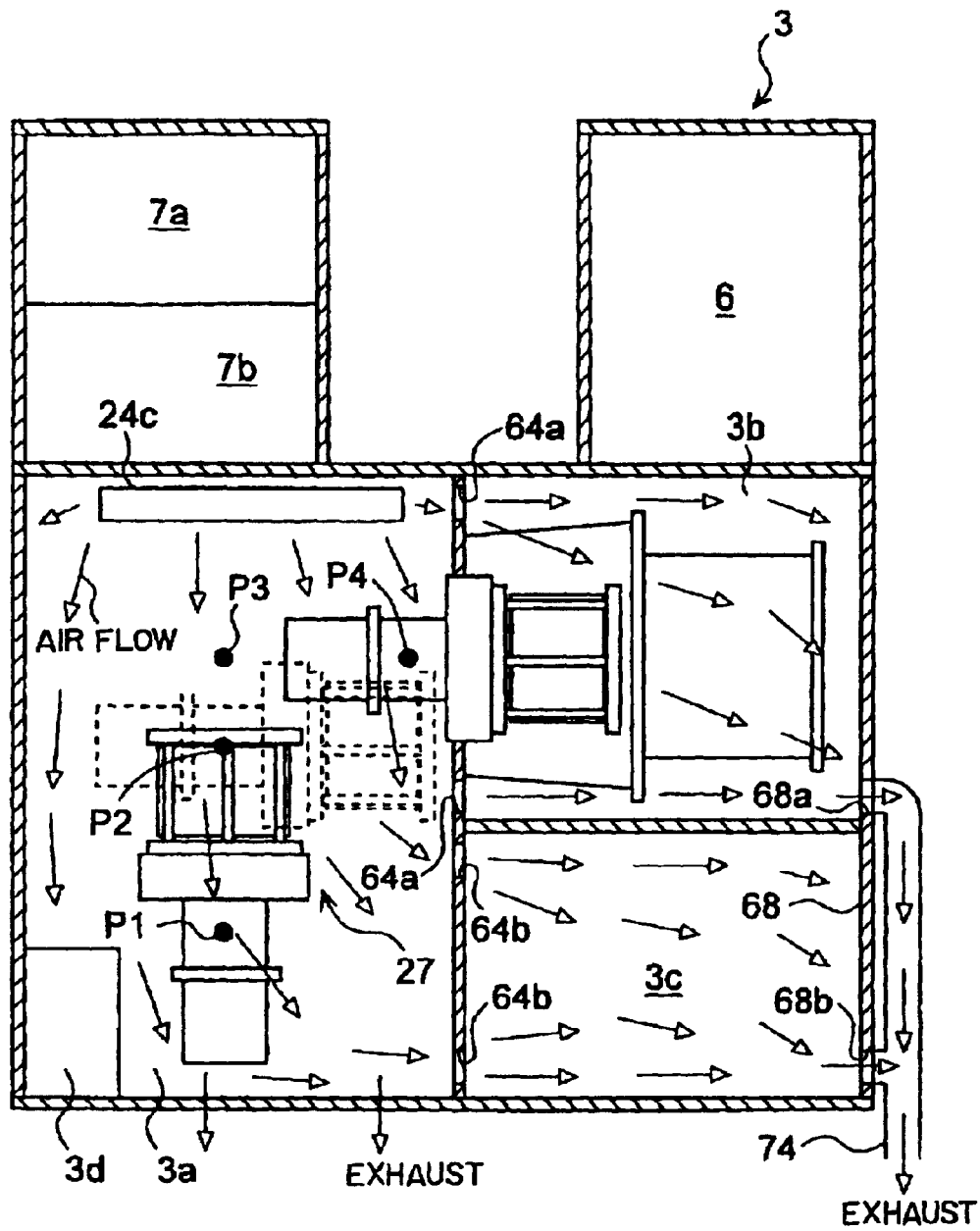
FIG. 10 is a cross-sectional view of a cleaning unit.

FIG. 10 is a sectional view of the cleaning unit 3. FIG. 10 shows an example of a state when the rotor rotating mechanism 27 is moved by means of the attitude converting mechanism 28, Z-axis linear driving mechanism 29 and X-axis linear driving mechanism 30 which are shown in FIG. 5. For example, when the rotor 34 is caused to enter the outer processing vessel 71a after the wafers W are transferred to the rotor 34, it is required to first transfer the wafers W from the conveying arm 17a to the rotor 34. At this time, it is assumed that the connecting member 32 (FIG. 5) is positioned at a position P1 and the rotor rotating mechanism 27 is in a vertical attitude.

After the wafers W are housed in the rotor 34, the Z-axis linear driving mechanism 29 is operated to move the rotation mechanism 27 and the attitude converting mechanism 28 upwards so that the connecting member 32 moves to a position P2. At the position P2, the attitude converting mechanism 28 is operated to rotate the whole rotor rotating mechanism 27 by ninety degrees so as to change the state of the wafers W from a horizontal holding state to a vertical holding state. Thus, the state of the whole rotor rotating mechanism 27 is in a horizontal state. Subsequently, while the rotor rotating mechanism 27 is in the horizontal state, the Z-axis linear driving mechanism 29 is operated again so as to move the connecting member 32 to a position P3, to move the rotor rotating mechanism 27 upwards.

Thus, by converting the attitude of the rotor rotating mechanism 27 at the intermediate point when the rotor rotating mechanism 27 is moved upwards, the height of the cleaning unit 3 can be lower than a case where the rotor rotating mechanism 27 is rotated when the connecting member 32 is positioned at the position P1 or P3. It is also possible to narrow a space, which is required to rotate and move the rotor rotating mechanism 27, to decrease a volume occupied by the wafer transfer chamber 3a. As shown in FIG. 10, it is possible to ensure a space 3d in the lower portion of the wafer transfer chamber 3a. For example, a control box for controlling the operation of the rotor rotating mechanism 27 can be provided in the space 3d. In this case, it is easy to connect and assemble the control box and the rotor rotating mechanism 27.

When the connecting member 32 reaches the position P3, the X-axis linear driving mechanism 30 is operated to horizontally move the connecting member 32 to a position P4, so that the rotor 34 can be inserted into the outer processing vessel 71a. After the cleaning of the wafers W is completed, the rotor rotating mechanism 27 is moved in the opposite route to the above described moving route, so that the cleaned wafers W can be transferred to the conveying arm 17b.

From the FFU 24c provided on the ceiling portion of the wafer transfer chamber 3a, clean air (down flow) is fed to the wafer transfer chamber 3a. Thus, the adhesion of particles and so forth to the wafers W, which are handled in the uncovered state, is prevented. The flow of the down flow from the FFU 24c is shown in FIG. 10. As shown in FIG. 10, a part of the down flow is exhausted from an outlet (not shown) which is provided in the bottom plate of the wafer transfer chamber 3a.

In the cleaning unit 3, a part of the down flow from the FFU 24c passes through vent holes 64a, which are formed in the vertical wall 62a, to flow into the processing-vessel chamber 3b. The flow, which has flown into the processing-vessel chamber 3b, passes through an outlet 68a, which is formed in another side wall panel 68 constituting the processing-vessel chamber 3b, to be exhausted from an exhaust pipe 74. A part of the down flow from the FFU 24c passes through vent holes 64b, which are formed in the vertical wall 62a, to flow into the utility chamber 3c. The flow, which has flown into the utility chamber 3c, passes through an outlet 68b, which is formed in another side wall panel 68 constituting the utility chamber 3c, to be exhausted from the exhaust pipe 74.

For example, the vent holes 64a can be formed at the four corners of the vertical wall 62a in the processing-vessel chamber 3b. Similarly, the vent holes 64b can be formed at the four corners of the vertical wall 62a in the utility chamber 3c. For example, the outlet 68a can be formed in the lower portion of the side wall panel 68 in the processing-vessel chamber 3b, and the outlet 68b can be formed in the lower portion of the side wall panel 68 in the utility chamber 3c.

In the processing-vessel chamber 3b, the wafers W are arranged at least in the outer processing vessel 71a. In the utility chamber 3c, the wafers W are not handled. Since the cleanliness required for the process vessel chamber 3b and the utility chamber 3c is lower than the cleanliness required for the wafer transfer chamber 3a, it is not required to newly provide an FFU by incorporating a part of the down flow in the FFU 24c. Thus, it is possible to save the space for the cleaning unit 3 to reduce the costs of the system.

Subsequently, the internal structure of the processing-vessel chamber 3b will be described. While the rotor 34 enters the outer processing vessel 71a, the opening 62c formed in the vertical wall 62a is closed by the lid 33 provided in the rotor rotating mechanism 27, as shown in FIGS. 7 and 8. At this time, the gap between the outer peripheral surface of the lid 33 and the opening 62c is sealed by the sealing mechanism 63a. Thus, it is possible to prevent the processing liquid from flying from the outer processing vessel 71a to the wafer transfer chamber 3a. The sealing mechanism 63a may be formed of, e.g., a rubber tube or rubber seal ring, which have a sealing function if expanded by air or the like having a predetermined pressure. Such a sealing mechanism may be similarly used for the sealing mechanism 63b, 67a and 67b.

With respect to the cylindrical body 61a constituting the outer processing vessel 71a, the outer diameter on the side of the ring member 62b is set to be larger than the diameter on the side of the vertical wall 62a. The cylindrical body 61a is inclined so that the bottom end on the side of the ring member 62b is lower than the bottom end on the side of the vertical wall 62a. Thus, various processing liquids discharged from the processing liquid discharging nozzle 53 toward the wafers W flow on the bottom face of the cylindrical body 61a from the side of the vertical wall 62a toward the ring member 62b to pass through the exhaust/liquid-discharging pipe 65a to be naturally discharged to the outside.

In the lower portion of the opening 62c on the side of the wafer transfer chamber 3a in the vertical wall 62a, a liquid receiver 62e is provided. This liquid receiver 62e is provided for preventing a cleaning liquid, which has adhered to the lid 33 and the sealing mechanism 63a, from leaking out of the opening when the rotor rotating mechanism 27 is moved so that the rotor 34 leaves the outer processing vessel 71a. Thus, it is possible to hold the clean wafer transfer chamber 3a.

To the processing liquid discharging nozzle 53, processing liquids, such as pure water, IPA and various chemicals, and a dry gas, such as nitrogen ($N_2$) gas, are supplied from processing liquid supply sources, such as the chemical storing unit 5. These processing liquids and so forth are discharged from the processing liquid discharging holes 54 toward the wafers W held by the rotor 34. Although only one processing liquid discharging nozzle 53 is shown in FIGS. 7 and 8, a plurality of processing liquid discharging nozzles 53 may be provided. The discharging nozzle 53 must not always be provided just above the cylindrical body 61a. This is the same with respect to the processing liquid discharging nozzle 55.

In order to facilitate the discharge of the processing liquids to the outside, the lower portion of the cylindrical body 61b is formed with a groove 69 which protrudes from the cylindrical body 61b and which has a predetermined gradient. Thus, for example, when the inner processing vessel 71b is arranged at the processing position, the processing liquid discharged from the processing liquid discharging nozzle 55 toward the wafers W flows through the groove 69 to be discharged to the outside via the exhaust/liquid-discharging pipe 65b. To the processing liquid discharging nozzle 55, processing liquids, such as various chemicals, pure water and IPA, are supplied from the processing liquid supply sources, such as the chemical storing unit 5. Then, these processing liquids and so forth can be discharged toward the wafers W held by the rotor 34.

When the inner processing vessel 71b is in the processing position, the gap between the inner peripheral surface of the ring member 66a and the lid 33 is sealed by the sealing mechanism 67a as shown in FIG. 8. Simultaneously, the gap between the ring member 66b and the ring member 62b is sealed by the sealing mechanism 67a, and the gap between the ring member 66b and the disk 92a is sealed by the sealing mechanism 67b. Thus, when the inner processing vessel 71b is arranged at the processing position, a processing chamber 52 is formed by the cylindrical body 61b, the ring members 66a and 66b, the disk 92a and the lid 33. For example, in this processing chamber 52, a chemical processing for supplying a predetermined chemical to the wafers W can be carried out.

On the other hand, while the inner processing vessel 71b is in the retracted position, the gap between the ring member 66a and the ring member 62b is sealed by the sealing mechanism 63b. Simultaneously, the gap between the ring member 66a and the disk 92a is sealed by the sealing mechanism 67a. The opening 62a is closed by the lid 33 and the sealing mechanism 63a. Therefore, when the inner processing vessel 71a is arranged at the retracted position, a processing chamber 51 defined by the outer processing vessel 71a is formed by the cylindrical body 61a, the vertical wall 62a, the ring member 62b, the disk 92a, the ring member 66a and the lid 33. For example, after the chemical processing in the processing chamber 53 is completed, the wafers W can be washed with water and dried in the processing chamber 51.

From the cleaning liquid discharging nozzle 73a provided in the disk 82a, a cleaning liquid and a dry gas for cleaning and drying the disk 35a can be discharged. From the cleaning liquid discharging nozzle 73b provided in the lid 33, a cleaning liquid and a dry gas for cleaning and drying the disk 35b can be discharged. From the cleaning liquid discharging nozzles 73a and 73b, gases, such as oxygen ($O_2$) gas and carbon dioxide ($CO_2$) gas, can be discharged in order to cause the processing chambers 51 and 52 to be in a predetermined gas atmosphere. From the exhaust pipe 73c provided in the disk 92a, the processing chambers 51 and 51 can be exhausted.

In a state that the inner processing vessel 71 is in the retracted position, the gap between the ring member 66a and the disk 92a is sealed, and the gap between the ring member 66b and the ring member 92b is sealed by the sealing mechanism 67b. Thus, a narrow annular space 72 is formed between the outer periphery of the cylindrical body 91 and the inner periphery of the cylindrical body 61b. The cleaning liquid can be discharged from the processing liquid discharging nozzle 55 to the annular space 72 to clean the inner peripheral surface of the inner processing vessel 71b. Thereafter, a dry gas, such as nitrogen gas, is injected from the a plurality of gas supply nozzles 93 provided in the cylindrical body 91 and from the processing liquid discharging nozzle 55, to exhaust air from the exhaust pipe 94 and the exhaust/liquid-discharging pipe 65b. At this time, by utilizing the narrow annular space 71, the quantity of the cleaning liquid to be used is reduced. The cleaning liquid may be discharged from the gas supply nozzle 93.

The process controller in the control box 7b provided in the upper portion of the cleaning unit 3 is designed to be capable of controlling the operation of various driving mechanisms, which are provided in the processing-vessel chamber 3b and utility chamber 3c, to control a series of processing operations for the wafers in the cleaning unit 3. In this case, for example, the process controller can carry out the above described control while transmitting and receiving control signals to and from a controller for controlling the operation of the rotor rotating mechanism 27 in a box which is provided in the above described space 3d of the wafer transfer chamber 3a. If the control box for the controller for controlling the operation of various driving mechanisms in the cleaning unit 3 is thus provided in the cleaning unit 3, it is possible to easily carry out the assembly and maintenance of the cleaning unit 3, and thus, the assembly and maintenance of the whole cleaning system 1.

As described above, the cleaning unit 4 and the chemical storing unit 5 are supported on the same frame. Therefore, even if the control box 7a, in which the temperature controller for controlling the temperature of the chemical stored in the chemical storing unit 5 is housed, is provided in the cleaning unit 3, there is no problem on transportation and assembly. Similar to a case where the temperature control box 7a is provided in the chemical storing unit 5, it is possible to easily carry out the assembly and maintenance of the chemical storing unit 5, and thus, the assembly and maintenance of the whole cleaning system 1.

Although the power supply unit 6 is provided in the cleaning unit 3, the temperature control box 7a and process control box 7b, which are provided in the cleaning unit 3, can be always connected to the power supply unit 6. In the wafer conveying unit 4 supported on a frame which is different from the frame of the cleaning unit 3, the controllers for various driving mechanisms provided in the wafer conveying unit 4 are collectively housed in the conveying mechanism control box 10. Thus, the assembly and so forth of the cleaning system 1 only include the working for connecting the operation panel 4a, the conveying mechanism control box 10 and the power supply unit 6, so that it is possible to shorten the assembly time.

In the chemical storing unit 5, there are provided tanks for storing various chemicals, a liquid feed control mechanism for feeding the stored chemicals, a fire detecting sensor, a fire extinguishing nozzle and so forth. The wall panel is provided with a monitor for showing the inside state, an alarm lamp which is turned on when abnormality occurs inside, a fire extinguishing button, and so forth. The fire extinguishing button is provided for operating a fire extinguishing device when fire occurs in the processing-vessel chamber 3b or the chemical storing unit 5. In the upper portion of the chemical storing unit 5, a heat exhaust box 8 is provided. A heat exhaust unit housed in the heat exhaust box 8 can collect heated air exhausted from the respective boxes arranged in an upper portion of the cleaning system 1, and collectively exhaust the heated air to the outside.

Figure 11:
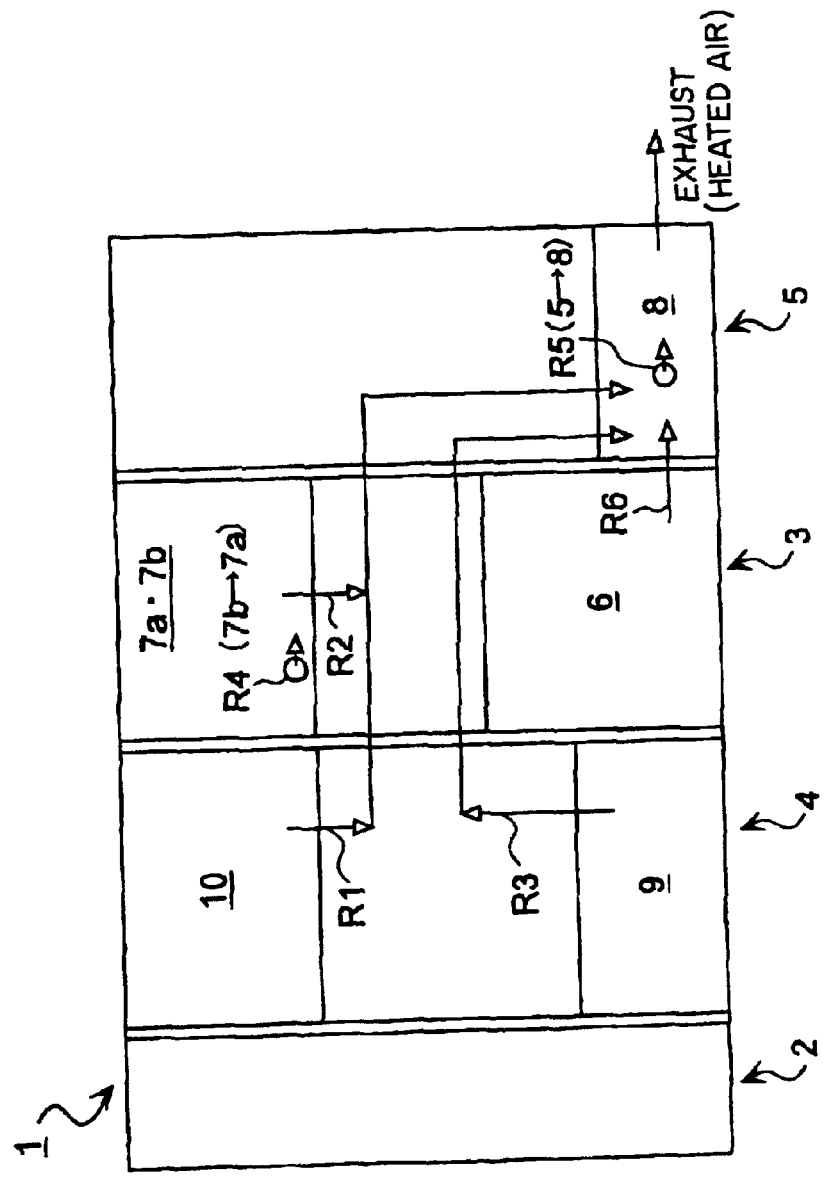
FIG. 11 is a schematic diagram showing a horizontal section of a heat exhaust path of a cleaning system.

FIG. 11 is an illustration showing the heat exhaust path. In FIG. 11, a route 1 (R1) shows an exhaust route from the conveying mechanism control box 10. A route 4 (R4) shows an exhaust route from the process control box 7b to the temperature control box 7a provided above the process control box 7b. A route 2 (R2) shows an exhaust route from the temperature control box 7a. The route 2 (R2) meets the route 1 (R1) to reach the heat exhaust box 8. A route 3 (R3) shows an exhaust route from the display box 9, a route 5 shows an exhaust route from the chemical storing unit 5, and a route (R6) shows an exhaust route from the power supply box 6. These routes 4 (R4) through 6 (R6) directly reach the heat exhaust box 8. Thus, it is possible to exhaust air from the heat exhaust box 8 by a single exhaust route.

If the controllers and so forth are thus boxed to be centralized and arranged in an upper portion of the cleaning system 1, the exhaust system of the cleaning system 1 can have a simple structure. Thus, even if the frame constituting the cleaning system 1 as described above has a different structure between the wafer conveying unit 4 and the cleaning unit 3, it is possible to easily carry out the connection and disassembly of piping when the assembly and maintenance of the cleaning system 1 are carried out.

Assuming that the hoop F mounted on the hoop stage 2a is hoop F1 and that the hoop F mounted on the hoop stage 2b is hoop F2, cleaning steps for cleaning wafers W housed in the two hoops F1 and F2 will be described below. First, the hoops F1 and F2, in which twenty-five wafers W are housed at regular intervals in parallel, are mounted on the hoop stages 2a and 2b so that their wafer carrying ports face the windows 12a and 12b, respectively.

In order to convey the wafers W which are first housed in the hoop F1, the window 12a is open to establish the communication between the interior of the hoop F1 and the interior of the wafer conveying unit 4. Thereafter, the wafer inspection mechanism 110 is used for inspecting the number and state of the wafers W housed in the hoop F1. When it is detected that the state of the housed wafers W is abnormal, the processing for the wafers W in the hoop F1 is discontinued, and, for example, the processing for the wafers W housed in the hoop F2 is carried out.

If it is not detected that the state of the wafers W housed in the hoop F1 is abnormal, the following procedures are carried out. For example, it is assumed that the conveying arm 17a is used for conveying unprocessed wafers W. When the wafers W in the hoop F1 mounted on the hoop stage 2a are conveyed to the rotor 34, the conveying arm 17a is first moved to a position at which it can access the hoop F1 mounted on the hoop stage 2a. Then, the height of the conveying arm 17a is adjusted by the lifting mechanism 23, to operate the sliding mechanism 20a to slide the conveying arm 17a and the supporting member 18a toward the hoop stage 2a. Then, the conveying arm 17a is caused to hold the wafers W, and the conveying arm 17a and the supporting member 18a are returned to the original position. Thus, the wafers W are carried out of the hoop F1.

Then, the rotating mechanism 22 is operated to rotate the table 21 by 180 degrees while moving the wafer conveying mechanism 16 to a position at which the conveying arm 17a can access the rotor 34. Then, after the window 25a is open to adjust the height by the lifting mechanism 23, the conveying arm 17a and the supporting member 18a are slid toward the rotor 34. Thus, the wafers W are transferred to the rotor 34 in which the movable member 36b is open to be held. After the movable member 36a is closed, the conveying of the wafers W to the rotor 34 is completed if the conveying arm 17a and the supporting member 18a are returned to the original position. When the wafers W are thus conveyed in the wafer conveying unit 4, the down flow is supplied from the FFUs 24a and 24b to the wafers W, so that the adhesion of particles and so forth to the wafers W is inhibited.

When the wafers W are held by the rotor 34, the rotor rotating mechanism 27 is moved so that the rotor 34 is inserted into the outer processing vessel 71a and so that the lid 33 is positioned at the opening 62c. The movement of the rotor rotating mechanism 27 is carried out by driving the attitude converting mechanism 28, the Z-axis linear moving mechanism 29 and the X-axis linear driving mechanism 30. At this time, the adhesion of particles and so forth to the wafers W is inhibited by the down flow from the FFU 24c.

The rotor rotating mechanism 27 is held at a predetermined position, and the sealing mechanism 63a is operated to seal the gap between the side face of the lid 33 and the opening 62c. Subsequently, the inner processing vessel 71b is moved to the processing position to seal the inner peripheral surface of the ring member 66a and the lid 33 by the sealing mechanism 67a. The gaps between the ring member 66b, the ring member 62b and the disk 92a are sealed by the sealing mechanisms 63a and 67b, to form the processing chamber 52. The inner processing vessel 71b may be previously moved to the processing position, and thereafter, the rotor 34 may be inserted into the inner processing vessel 71b.

After the processing chamber 52 is formed, while the motor 31 is driven to rotate the rotor 34, a predetermine chemical is supplied from the processing liquid discharging nozzle 55 to the wafers W to carry out a chemical processing. After the chemical processing is completed, the sealing based on the sealing mechanisms 63b, 67a and 67b is released, and the inner processing vessel 71b is moved to the retracted position. At this time, it is considered that the atmosphere in the processing chamber 52 leaks to the processing-vessel chamber 3b in a slight time. However, since the down flow from the FFU 24c has flowed into the processing-vessel chamber 3b, the atmosphere of the chemical leaking from the processing chamber 52, together with the down flow, is exhausted from the exhaust pipe 74, and the clean state in the processing-vessel chamber 3b is held.

After the inner processing vessel 71b is slid to the retracted position, the gaps between the ring member 66b, the ring member 62b and the disk 92a are sealed by the sealing mechanisms 63b and 67a. The gap between the ring member 66b and the ring member 92b is sealed by the sealing mechanism 67b. Thus, in the processing chamber 51 formed by the outer processing vessel 71a, pure water is discharged from the processing liquid discharging nozzle 53 and the cleaning liquid discharging nozzles 73a and 73b to carry out a washing processing while rotating the wafers W. Then, for example, a drying processing is carried out by nitrogen gas. On the other hand, in the annular space 72, the inner processing vessel 71 is cleaned with the cleaning liquid from the processing liquid discharging nozzle 55. Thereafter, by exhausting air from the exhaust pipe 94 while discharging a dry gas from the gas supply nozzle 93 and processing liquid discharging nozzle 55, the inner processing vessel 71b is dried. Thus, the inner processing vessel 71b can be used for processing the wafers W in the next lot with chemicals.

Thus, while the wafers W are being processed in the cleaning unit 3, the following operation is carried out in the wafer conveying unit 4. First, the conveying arm 17a which does not hold the wafers W is caused to access the hoop F2 mounted on the hoop stage 2b. Then, by the same method as that when the wafers W are carried out of the hoop F1, the wafers W housed in the hoop F2 are transferred to the conveying arm 17a. The wafer conveying mechanism 16 is operated so that the conveying arm 17b holding no wafers W can access the rotor 34.

After the cleaning is completed in the cleaning unit 3, the sealing of the sealing mechanism 63a is released. The X-axis linear driving mechanism 30 and so forth are driven to return the rotor rotating mechanism 27 to a position at which the wafers W can be delivered between the conveying arms 17a, 17b and the rotor 34. The holder opening/closing mechanism 80 is moved to the processing position to open the window 25a. Then, the conveying arm 17b is caused to access the rotor 34 to open the movable member 36b to transfer the wafers W, which are held by the rotor 34, to the conveying arm 17b. Subsequently, the rotating mechanism 22 is operated to rotate the table 21 by 180 degrees so that the conveying arm 17a can access the rotor 34. Then, unprocessed wafers W held by the conveying arm 17a are transferred to the rotor 34.

The unprocessed wafers (wafers which used to be housed in the hoop F2) W held by the rotor 34 are cleaned by the same steps as those in the cleaning process for the wafers W (wafers which used to be housed in the hoop F1). Thereafter, the rotor 34 is moved to a position at which the wafers W can be delivered from and to the rotor 34. Meanwhile, the conveying arm 17b is caused to access the hoop F1, and the cleaned wafers W are transferred to the hoop F1. Thereafter, the wafer conveying mechanism 16 is in a state that the conveying arm 17b can access the rotor 34.

If the conveying arm 17b receives the wafers W (wafers which used to be housed in the hoop F2), which have been cleaned, from the rotor 34 to house the wafers W in the hoop F2, the cleaning of the wafers W housed in the hoops F1 and F2 is completed. For example, if the hoop F3 accommodating therein the wafers W is arranged in the hoop stage 2c and if the wafers W in the hoop F3 are continuously cleaned after the cleaning of the wafers W in the hoop F2, the following operation is carried out. First, the wafers W in the hoop F2 are transferred to the rotor 34, and the cleaned wafers W in the hoop F1 are housed in the hoop F1. Thereafter, the wafers W housed in the hoop F3 are taken out by the conveying arm 17a. Then, after the cleaned wafers W in the hoop F2 are carried out of the rotor 34, the wafers W in the hoop F3 held by the conveying arm 17a are transferred to the rotor 34. Thus, a predetermined cleaning can be continuously carried out.

While the preferred embodiment of the present invention has been described, the present invention should not be limited to the preferred embodiment. For example, in the cleaning unit 3, the processing-vessel chamber 3b and the utility chamber 3c may be provided as a single chamber, not as separate chambers. There is no limit to the number of wafers W to be processed if the wafers W can be held by the rotor 34. While the processing vessel 70 has had the double structure, one processing vessel may be used, or the processing vessel may have a triple structure.

The system according to the present invention can be applied to an applying processing for applying a predetermined applied liquid, or an etching processing. The number of the frames constituting the system should not be limited to two, it may be three or more. While the substrate has been the semiconductor wafer, the present invention should not be limited thereto, but the invention may be applied to the processing for other substrates, such as substrates for liquid crystal displays (LCDs).

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A system for processing a substrate with a processing liquid, said system comprising:
    a substrate transfer chamber provided with a holder formed so as to hold a substrate, said substrate being transferred between said holder and an outside of said substrate transfer chamber;
    a blower mechanism provided in a ceiling portion of said substrate transfer chamber; and
    a processing-vessel chamber provided with a processing vessel, said substrate held by said holder being carried into said processing vessel and said processing liquid being supplied to said substrate in said vessel to process said substrate with said processing liquid,
    wherein air supplied from said blower mechanism to said substrate transfer chamber is exhausted from said substrate transfer chamber via said processing-vessel chamber.

2. The system as set forth in claim 1, wherein said processing vessel has an opening for allowing said holder to pass therethrough, and
    wherein a lid capable of closing said opening of said processing vessel and a rotating mechanism for rotating said holder are integrally formed with said holder.

3. The system as set forth in claim 1, wherein said substrate transfer chamber has:
    an attitude converting mechanism for converting the attitude of said holder such that a principal plane of said substrate held by said holder is set substantially horizontally or vertically;
    a lifting mechanism for vertically moving said holder and said attitude converting mechanism; and
    a horizontal moving mechanism for moving said holder, said attitude converting mechanism and said lifting mechanism in horizontal directions.

4. The system as set forth in claim 1, wherein said processing vessel has:
    an outer processing vessel fixed in said processing-vessel chamber; and
    an inner processing vessel slidable between a processing position at which said inner processing vessel is housed in said outer processing vessel, and a retracted position at which said inner processing vessel is retracted from said outer processing vessel.

5. A system for processing a substrate with a processing liquid, said system comprising:
    a substrate transfer chamber provided with a holder formed so as to hold a substrate, said substrate being transferred between said holder and an outside of said substrate transfer chamber;
    a blower mechanism provided in a ceiling portion of solid substrate transfer chamber;
    a processing-vessel chamber provided with a processing vessel, said substrate held by said holder being carried into said processing vessel and said processing liquid being supplied to said substrate in said vessel to process said substrate with said processing liquid; and
    a utility chamber provided with a liquid feeding mechanism for feeding said processing liquid to said processing vessel, and a processing liquid recovering mechanism for recovering said processing liquid fed to said processing vessel,
    wherein air supplied from said blower mechanism to said substrate transfer chamber is exhausted from said substrate transfer chamber via said processing-vessel chamber or said utility chamber.

6. The system as set forth in claim 5, wherein said processing vessel has an opening for allowing said holder to pass therethrough, and
    wherein a lid capable of closing said opening of said processing vessel and a rotating mechanism for rotating said holder are integrally formed with said holder.

7. The system as set forth in claim 5, wherein said substrate transfer chamber has:
    an attitude converting mechanism for converting the attitude of said holder such that a principal plane of said substrate held by said holder is set substantially horizontally or vertically;
    a lifting mechanism for vertically moving said holder and said attitude converting mechanism; and
    a horizontal moving mechanism for moving said holder, said attitude converting mechanism and said lifting mechanism in horizontal directions.

8. The system as set forth in claim 5, wherein said processing vessel has:
    an outer processing vessel fixed in said processing-vessel chamber; and
    an inner processing vessel slidable between a processing position at which said inner processing vessel is housed in said outer processing vessel, and a retracted position at which said inner processing vessel is retracted from said outer processing vessel.

9. A system for processing a substrate with a processing liquid, said system comprising:
    a case carrying unit for carrying in/out a case accommodating therein said substrate;
    a liquid-processing unit for supplying said processing liquid to process said substrate with said processing liquid; and
    a substrate conveying unit for conveying said substrate between said case carrying unit and said liquid-processing unit,
    said liquid-processing unit comprising:
    a substrate transfer chamber provided with a holder formed so as to hold a substrate, said substrate being transferred between said holder and said substrate conveying unit;

a blower mechanism provided in a ceiling portion of said substrate transfer chamber;

a processing-vessel chamber provided with a processing vessel, said substrate held by said holder being carried into said processing vessel and said processing liquid being supplied to said substrate in said vessel to process said substrate with said processing liquid; and a utility chamber provided with a liquid feeding mechanism for feeding said processing liquid to said processing vessel, and a processing liquid recovering mechanism for recovering said processing liquid fed to said processing vessel, wherein air supplied from said blower mechanism to said substrate transfer chamber is exhausted from said substrate transfer chamber via said processing-vessel chamber or said utility chamber.

10. The system as set forth in claim 9, wherein said processing vessel has an opening for allowing said holder to pass therethrough, and wherein a lid capable of closing said opening of said processing vessel and a rotating mechanism for rotating said holder are integrally formed with said holder.

11. The system as set forth in claim 9, wherein said substrate transfer chamber has:

an attitude converting mechanism for converting the attitude of said holder such that a principal plane of said substrate held by said holder is set substantially horizontally or vertically;

a lifting mechanism for vertically moving said holder and said attitude converting mechanism; and a horizontal moving mechanism for moving said holder, said attitude converting mechanism and said lifting mechanism in horizontal directions.

12. The system as set forth in claim 9, wherein said processing vessel has:

an outer processing vessel fixed in said processing-vessel chamber; and an inner processing vessel slidable between a processing position at which said inner processing vessel is housed in said outer processing vessel, and a retracted position at which said inner processing vessel is retracted from said outer processing vessel.

* * * * *